United States Patent
Lai et al.

(10) Patent No.: US 10,288,712 B2
(45) Date of Patent: May 14, 2019

(54) APPARATUS AND METHOD FOR CONTROLLING PULSE SEQUENCE OF MAGNETIC RESONANCE IMAGING SYSTEM

(71) Applicant: General Electric Company, Schenectady, NY (US)

(72) Inventors: Yongchuan Lai, Beijing (CN); Moran Wei, Waukesha, WI (US); Xiaoxi Mao, Beijing (CN)

(73) Assignee: GENERAL ELECTRIC COMPANY, Schenectady, NY (US)

(*) Notice: Subject to any disclaimer, the term of this patent is extended or adjusted under 35 U.S.C. 154(b) by 216 days.

(21) Appl. No.: 15/252,727

(22) Filed: Aug. 31, 2016

(65) Prior Publication Data
US 2017/0059681 A1    Mar. 2, 2017

(30) Foreign Application Priority Data

Aug. 31, 2015 (CN) .......................... 2015 1 0546374

(51) Int. Cl.
*G01V 3/00* (2006.01)
*G01R 33/563* (2006.01)
*G01R 33/385* (2006.01)

(52) U.S. Cl.
CPC ... *G01R 33/56341* (2013.01); *G01R 33/3852* (2013.01)

(58) Field of Classification Search
CPC .. G01R 33/34; G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659;

(Continued)

(56) References Cited

U.S. PATENT DOCUMENTS 5,588,431 A * 12/1996 Mani .................... A61B 5/0263
                                                        324/307
7,498,808 B2 * 3/2009 Asano ................ G01R 33/4828
                                                        324/307

(Continued)

*Primary Examiner* — Thang X Le

(57) ABSTRACT

The present invention provides an apparatus and method for controlling a pulse sequence of a magnetic resonance (MR) imaging system, the MR imaging system comprising a radio frequency magnetic field coil and a gradient magnetic field coil, the apparatus for controlling a pulse sequence of the MR imaging system comprising a radio frequency driving unit and a gradient driving unit. The gradient driving unit is used for applying a first motion probing gradient (MPG) pulse and a second MPG pulse to the gradient magnetic field coil successively. The radio frequency driving unit is used for applying a radio frequency excitation pulse to the radio frequency magnetic field coil before the first MPG pulse is applied, and for applying a first 90-degree radio frequency refocusing pulse, a 180-degree radio frequency refocusing pulse and a second 90-degree radio frequency refocusing pulse to the radio frequency magnetic field coil successively between a time when the first MPG pulse is applied and a time when the second MPG pulse is applied.

10 Claims, 3 Drawing Sheets

(58) Field of Classification Search
CPC ........ G01R 33/56518; G01R 33/56536; G01R 33/56572; G01R 33/5614; G01R 33/5616; G01R 33/56509; G01R 33/341; G01R 33/385; G01R 33/56358; A61B 5/055; A61B 5/0555; A61B 5/7278; A61B 5/725
See application file for complete search history.

(56) References Cited

U.S. PATENT DOCUMENTS

| | | | | |
|---|---|---|---|---|
| 2007/0145974 A1* | 6/2007 | Asano | ................ | G01R 33/4828 324/307 |
| 2011/0092797 A1* | 4/2011 | Wang | .................... | G01R 33/56 600/410 |
| 2012/0302872 A1* | 11/2012 | Miyazaki | ............. | A61B 5/0263 600/419 |
| 2016/0047871 A1* | 2/2016 | Zhou | .................. | G01R 33/5635 324/309 |

* cited by examiner

US 10,288,712 B2

APPARATUS AND METHOD FOR CONTROLLING PULSE SEQUENCE OF MAGNETIC RESONANCE IMAGING SYSTEM

CROSS-REFERENCE TO RELATED APPLICATIONS

This application claims priority to Chinese patent application number 201510546374.8, filed on Aug. 31, 2015, the entirety of which is incorporated herein by reference.

BACKGROUND

The present invention relates to the field of medical imaging, particularly to an apparatus and method for controlling a pulse sequence of a magnetic resonance imaging system.

A magnetic resonance (MR) imaging system includes a radio frequency system and a gradient system. The radio frequency system is used for emitting a radio frequency pulse with a certain frequency and power such that hydrogen protons within a detected object generate a resonance, and for receiving an MR signal generated by the hydrogen protons within the detected object, the MR signal being used for performing image reconstruction on a detected part of the detected object. The gradient system is used for emitting a level selecting gradient pulse, a phase encoding gradient pulse and a frequency encoding gradient pulse (also referred to as a readout gradient pulse) to provide three-dimensional position information for the above MR signal so as to achieve the image reconstruction.

When MR scan imaging is performed, an apparatus for controlling a pulse sequence controls the radio frequency system and the gradient system to emit a desired pulse sequence according to a preset timing to perform the scan imaging on a specific detected part of the detected object.

Diffusion weighted imaging (DWI) is a new MR imaging method, which has been more and more widely used in the field of medical diagnosis. Since in the DWI, the pulse sequence includes two motion probing gradient (MPG) pulses with larger widths and amplitudes applied on a gradient magnetic field coil, whose power consumption takes up a large part of power consumption of the whole DWI imaging, the existing power supply sometimes cannot satisfy the requirements of power consumption. In order to solve the problem of power, in the process of scanning, the operation sometimes needs to stop for a period of time after the two MPG pulses are applied so as to recover the power, which results in a longer scanning time.

Those skilled in the art have attempted to reduce the power consumption by decreasing the amplitudes of the MGP pulses or increasing a time interval between the two MPG pulses. However, such method will increase a time of echo, which will decrease a signal-to-noise ratio significantly and lower the image quality.

Accordingly, there is a need to provide a novel apparatus and method for controlling a pulse sequence of a MR imaging system that can reduce power consumption while ensuring the image quality.

SUMMARY

An exemplary embodiment of the present invention provides an apparatus for controlling a pulse sequence of an MR imaging system, the MR imaging system comprising a radio frequency magnetic field coil and a gradient magnetic field coil. The apparatus for controlling a pulse sequence of the MR imaging system comprises a radio frequency driving unit and a gradient driving unit. The gradient driving unit is used for applying a first MPG pulse and a second MPG pulse to the gradient magnetic field coil successively. The radio frequency driving unit is used for applying a radio frequency excitation pulse to the radio frequency magnetic field coil before the first MPG pulse is applied, and for applying a first 90-degree radio frequency refocusing pulse, a 180-degree radio frequency refocusing pulse and a second 90-degree radio frequency refocusing pulse to the radio frequency magnetic field coil successively between a time when the first MPG pulse is applied and a time when the second MPG pulse is applied.

An exemplary embodiment of the present invention also provides a method for controlling a pulse sequence of an MR imaging system, the MR imaging system comprising a radio frequency magnetic field coil and a gradient magnetic field coil, the method for controlling a pulse sequence of the MR imaging system comprising:

applying a radio frequency excitation pulse to the radio frequency magnetic field coil;

applying a first MPG pulse to the gradient magnetic field coil after the radio frequency excitation pulse is applied;

applying a first 90-degree radio frequency refocusing pulse, a 180-degree radio frequency refocusing pulse and a second 90-degree radio frequency refocusing pulse to the radio frequency magnetic field coil successively after the first MPG pulse is applied;

applying a second MPG pulse to the gradient magnetic field coil after the second 90-degree radio frequency refocusing pulse is applied.

Other features and aspects will become apparent from the following Detailed Description, the Drawings and the Claims.

BRIEF DESCRIPTION OF THE DRAWINGS

The present invention can be understood better in light of the description of exemplary embodiments of the present invention with reference to the accompanying drawings, in which.

DETAILED DESCRIPTION

Hereafter, a detailed description will be given for preferred embodiments of the present disclosure. It should be pointed out that in the detailed description of the embodiments, for simplicity and conciseness, it is impossible for the Description to describe all the features of the practical embodiments in details. It should be understood that in the process of a practical implementation of any embodiment, just as in the process of an engineering project or a designing project, in order to achieve a specific goal of the developer and in order to satisfy some system-related or business-related constraints, a variety of decisions will usually be made, which will also be varied from one embodiment to another. In addition, it can also be understood that although the effort made in such developing process may be complex and time-consuming, some variations such as design, manufacture and production on the basis of the technical contents disclosed in the disclosure are just customary technical means in the art for those of ordinary skilled in the art associated with the contents disclosed in the present disclosure, which should not be regarded as insufficient disclosure of the present disclosure.

Unless defined otherwise, all the technical or scientific terms used in the Claims and the Description should have the same meanings as commonly understood by one of ordinary skilled in the art to which the present disclosure belongs. The terms "first", "second" and the like in the Description and the Claims of the present utility model do not mean any sequential order, number or importance, but are only used for distinguishing different components. The terms "a", "an" and the like do not denote a limitation of quantity, but denote the existence of at least one. The terms "comprises", "comprising", "includes", "including" and the like mean that the element or object in front of the "comprises", "comprising", "includes" and "including" covers the elements or objects and their equivalents illustrated following the "comprises", "comprising", "includes" and "including", but do not exclude other elements or objects. The term "coupled" or "connected" or the like is not limited to being connected physically or mechanically, nor limited to being connected directly or indirectly.

Figure 1:
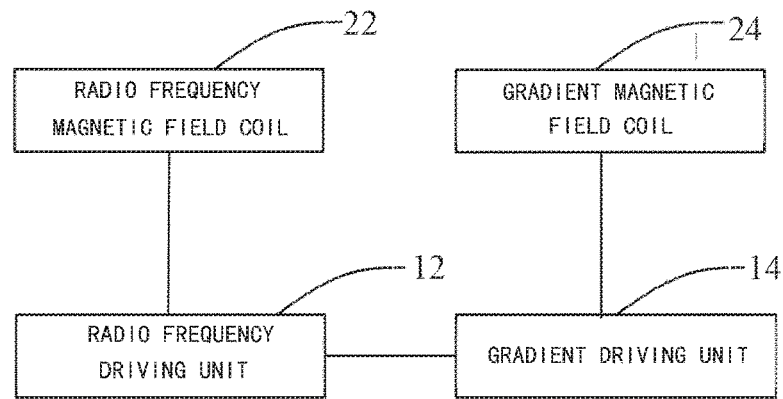
FIG. 1 is a block diagram of an apparatus for controlling a pulse sequence of an MR imaging system provided by one embodiment of the present invention.
Figure 2:
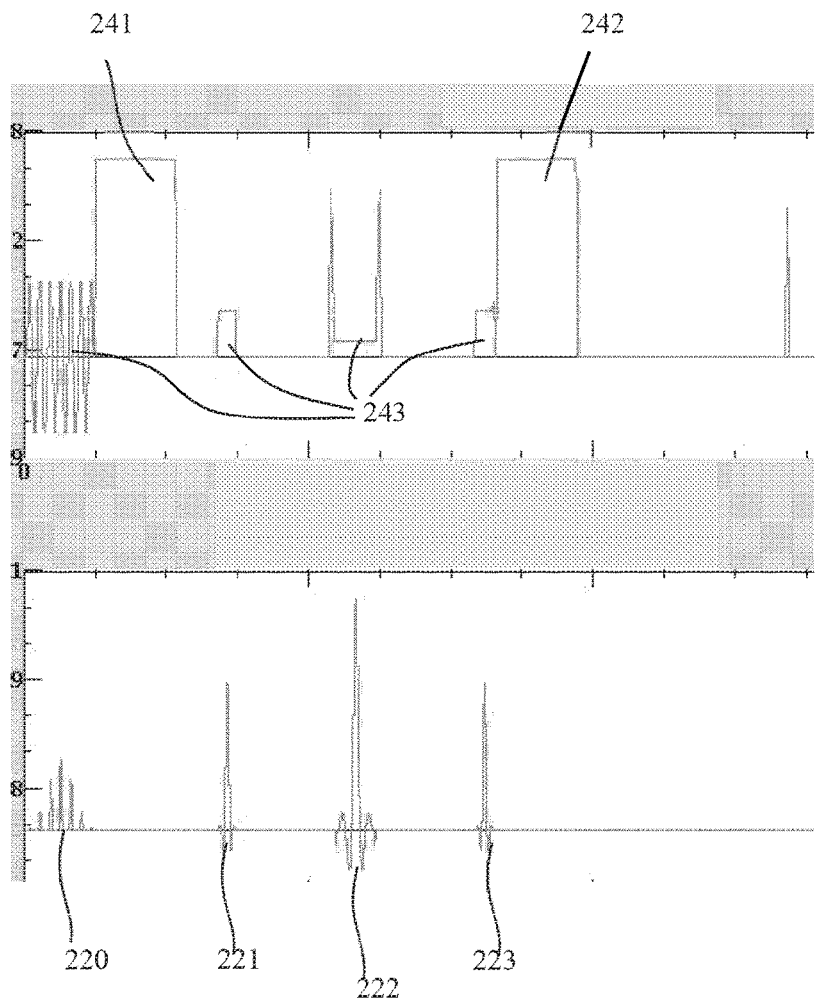
FIG. 2 is a timing chart of the pulse sequence generated by the apparatus for controlling a pulse sequence of an MR imaging system in FIG. 1.

FIG. 1 is a block diagram of an apparatus for controlling a pulse sequence of an MR imaging system provided by one embodiment of the present invention, and FIG. 2 is a timing chart of the pulses emitted by the apparatus for controlling a pulse sequence of an MR imaging system in FIG. 1.

As shown in FIG. 1, the above MR imaging system includes a radio frequency magnetic field coil 22 and a gradient magnetic field coil 24. The radio frequency magnetic field coil 22 is used for receiving a radio frequency pulse to generate a radio frequency magnetic field, and the gradient magnetic field coil 24 is used for receiving a gradient pulse to generate a gradient magnetic field. The apparatus for controlling a pulse sequence of an MR imaging system as described above includes a radio frequency driving unit 12 and a gradient driving unit 14. The radio frequency driving unit 12 and the gradient driving unit 14 are used for applying a desired pulse to the radio frequency magnetic field coil 22 and the gradient magnetic field coil 24 according to a preset pulse sequence respectively.

Specifically, the gradient driving unit 14 is used for applying a first MPG pulse 241 and a second MPG pulse 242 to the gradient magnetic field coil 24 successively.

The radio frequency driving unit 12 is used for applying a radio frequency excitation pulse 220 to the radio frequency magnetic field coil 22 before the first MPG pulse 241 is applied. The radio frequency driving unit 12 is further used for applying a first 90-degree radio frequency refocusing pulse 221, a 180-degree radio frequency refocusing pulse 222 and a second 90-degree radio frequency refocusing pulse 223 to the radio frequency magnetic field coil 22 successively between a time when the first MPG pulse 241 is applied and a time when the second MPG pulse 242 is applied.

The above radio frequency excitation pulse 220 is used for making protons within a specific level of a detected object resonate so as to generate an MR signal (an echo signal). The first MPG pulse 241 and the second MPG pulse 242 are used for making molecules (e.g., water molecules) within a detected tissue diffuse. The first 90-degree radio frequency refocusing pulse 221, the 180-degree radio frequency refocusing pulse 222 and the second 90-degree radio frequency refocusing pulse 223 are used for refocusing the attenuated MR signal to generate an echo signal that can be measured.

Optionally, the number of the above 180-degree radio frequency refocusing pulse 222 may be one. In order to reduce the effect of an eddy current, the number of the above 180-degree radio frequency refocusing pulse 222 may also be more.

Optionally, the above first MPG pulse 241 and second MPG pulse 242 both have a width of 14 ms.

Optionally, in order to improve the quality of the signal, the first 90-degree radio frequency refocusing pulse 221 and the second 90-degree radio frequency refocusing pulse 223 are symmetrical to each other with respect to the 180-degree radio frequency refocusing pulse 222. The above "symmetrical to each other" includes: time intervals being equal, pulse amplitudes being equal, pulse widths being equal, etc.

Optionally, the first 90-degree radio frequency refocusing pulse 221 and the second 90-degree radio frequency refocusing pulse 223 may not be a standard 90 degree. Similarly, the 180-degree radio frequency refocusing pulse 222 may not be a standard 180 degree, either.

Optionally, in order to improve the quality of the signal, the first MPG pulse 241 and the second MPG pulse 242 may not be symmetrical to each other with respect to the 180-degree radio frequency refocusing pulse 222, particularly, the time intervals may not be equal. For example, a time interval between the first MPG pulse 241 and the 180-degree radio frequency refocusing pulse 222 is greater than a time interval between the 180-degree radio frequency refocusing pulse 222 and the second MPG pulse 242.

Furthermore, as shown in FIG. 2, the gradient driving unit 14 is further used for applying level selecting gradient pulses 243 corresponding to the radio frequency excitation pulse 220, the first 90-degree radio frequency refocusing pulse 221, the second 90-degree radio frequency refocusing pulse 223 and the 180-degree radio frequency refocusing pulse 222 respectively to the gradient magnetic field coil 24.

Although FIG. 2 only shows that the first MPG pulse 241 and the second MPG pulse 242 are applied on the level selecting gradient sequence, it should be understood that the above first MPG pulse 241 and second MPG pulse 242 may also be applied on a phase encoding gradient sequence and/or a frequency encoding gradient sequence. For example, the MPG pulse pair (the first MPG pulse 241 and the second MPG pulse 242) may be individually applied on the level selecting gradient coil, the phase encoding gradient coil or the frequency encoding gradient coil, or may be asynchronously or synchronously applied on the level selecting gradient coil, the phase encoding gradient coil and the frequency encoding gradient coil, and the widths of the MPG pulses applied on the level selecting gradient coil, the phase encoding gradient coil and the frequency encoding gradient coil may be different.

Figure 3:
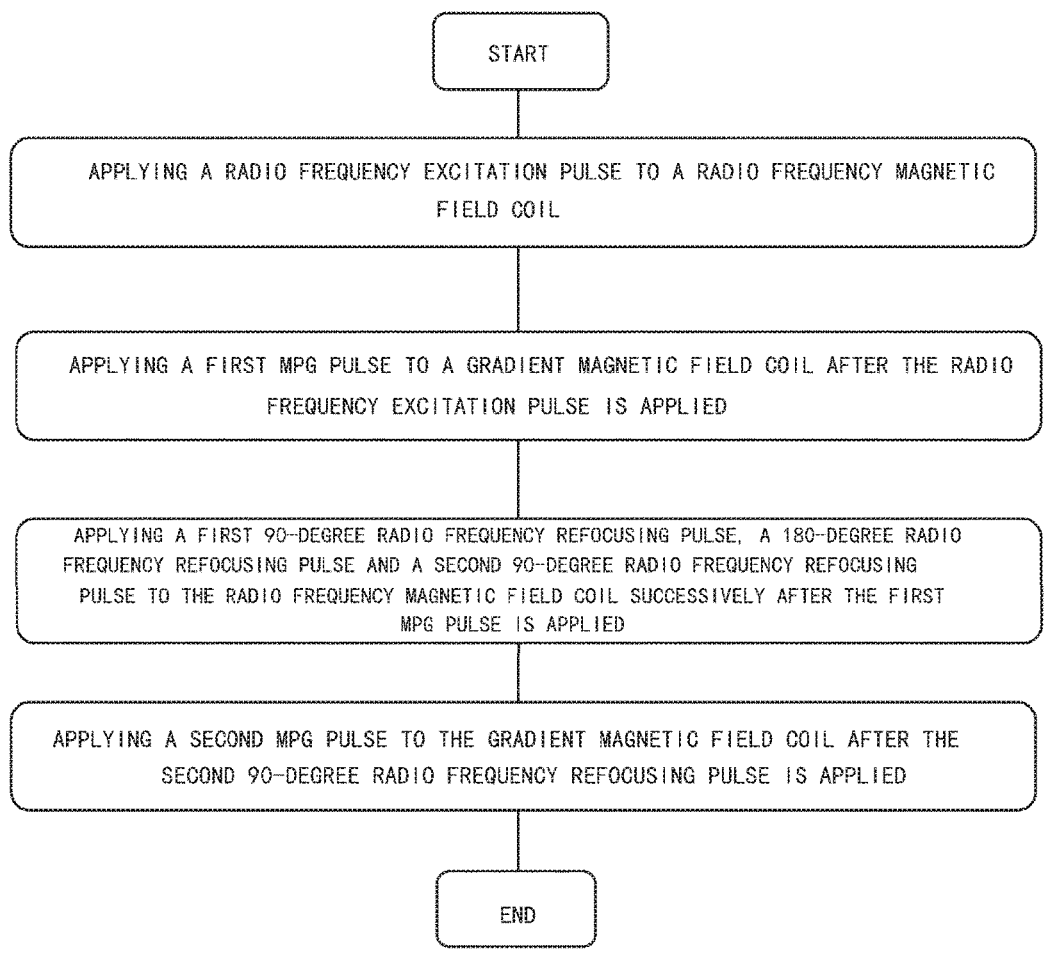
FIG. 3 is a flow chart of a method for controlling a pulse sequence of an MR imaging system provided by one embodiment of the present invention.

FIG. 3 is a flow chart of a method for controlling a pulse sequence of an MR imaging system provided by one embodiment of the present invention. The method may be implemented by the apparatus for controlling a pulse sequence of an MR imaging system in FIG. 1. As shown in FIG. 3, the method includes the following steps:

Step S31: applying the radio frequency excitation pulse 220 to the radio frequency magnetic field coil 22.

Step S33: applying the first MPG pulse 241 to the gradient magnetic field coil 24 after the radio frequency excitation pulse 220 is applied.

Step S35: applying the first 90-degree radio frequency refocusing pulse 221, the 180-degree radio frequency refocusing pulse 222 and the second 90-degree radio frequency refocusing pulse 223 to the radio frequency magnetic field coil 22 successively after the first MPG pulse 241 is applied. In this step, the first 90-degree radio frequency refocusing pulse 221 and the second 90-degree radio frequency refocusing pulse 223 are symmetrical to each other with respect to the 180-degree radio frequency refocusing pulse 222, and the number of the above 180-degree radio frequency refocusing pulse 222 may be one or more.

Step S37: applying the second MPG pulse 242 to the gradient magnetic field coil 24 after the second 90-degree radio frequency refocusing pulse 223 is applied. Optionally, a time interval between the first MPG pulse 241 and the 180-degree radio frequency refocusing pulse 222 is greater than a time interval between the 180-degree radio frequency refocusing pulse 222 and the second MPG pulse 242.

Optionally, the method for controlling a pulse sequence of an MR imaging system according to the embodiment of the present invention further includes the following steps: applying the level selecting gradient pulses 243 corresponding to the radio frequency excitation pulse 220, the first 90-degree radio frequency refocusing pulse 221, the second 90-degree radio frequency refocusing pulse 223 and the 180-degree radio frequency refocusing pulse 222 respectively to the gradient magnetic field coil 24.

The principle of the method for controlling a pulse sequence of an MR imaging system is the same as that of the apparatus for controlling a pulse sequence of an MR imaging system, which will not be repetitively described.

In the above embodiment of the present invention, two 90-degree radio frequency refocusing pulses are applied to the radio frequency magnetic field coil 22 between the first MPG pulse 241 and the second MPG pulse 242, and a 180-degree radio frequency refocusing pulse is applied between the two 90-degree radio frequency refocusing pulses. In this way, the widths of the first MPG pulse 241 and the second MPG pulse 242 may be reduced. However, by means of the above two 90-degree radio frequency refocusing pulses and the 180-degree radio frequency refocusing pulse therebetween, the obtained MR signal will not decrease as the time interval between the first MPG pulse 241 and the second MPG pulse 242 expands, thus greatly reducing the power consumption while ensuring the image quality, and avoiding the problem of lengthening the scanning time due to power recovery as well.

Figure 4:
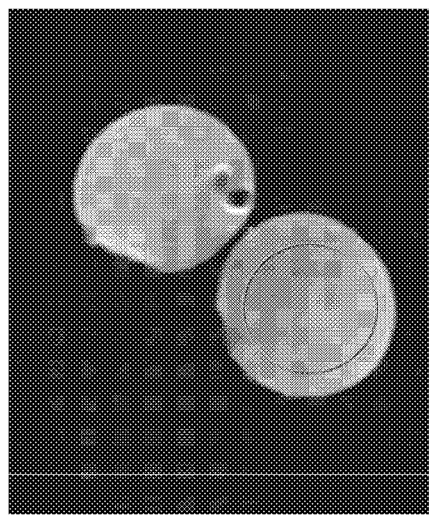
FIG. 4 is an image obtained by employing the existing pulse sequence in a DWI technology.
Figure 5:
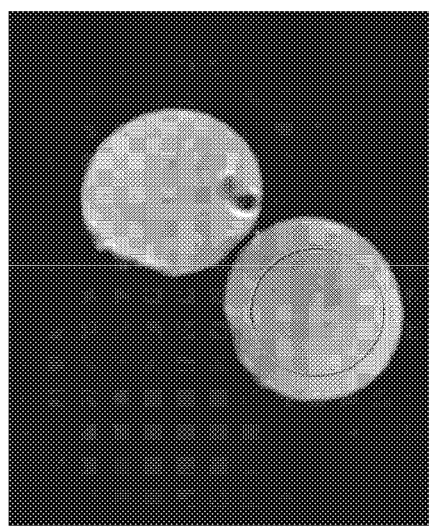
FIG. 5 is an image obtained by employing a pulse sequence of embodiments of the present invention in DWI.

FIG. 4 is an image obtained by employing the existing pulse sequence in a DWI technology, and FIG. 5 is an image obtained by employing a pulse sequence of embodiments of the present invention in DWI. Scanning environments corresponding to the images of FIG. 4 and FIG. 5 are the same. Comparing FIG. 4 with FIG. 5, it can be seen that by employing the pulse sequence of the embodiments of the present invention, the image whose quality is the same as that of the existing pulse sequence may be obtained, but since the widths of the two MPG pulses in the embodiments of the present invention are greatly reduced (which may be reduced from the existing 24 ms to 14 ms) compared to the MPG pulse in the existing pulse sequence, the power consumption of the two MPG pulses can be reduced by 40%. Moreover, by means of the embodiments of the present invention, the minimum time of repetition (TR) may be greatly shortened (e.g., from 230 ms to 150 ms) so that the scanning time is dramatically reduced.

Some exemplary embodiments have been described in the above. However, it should be understood that various modifications may be made thereto. For example, if the described techniques are carried out in different orders, and/or if the components in the described system, architecture, apparatus or circuit are combined in different ways and/or replaced or supplemented by additional components or equivalents thereof, proper results may still be achieved. Accordingly, other embodiments are also falling within the protection scope of the claims.

What is claimed is:

1. A magnetic resonance (MR) imaging system comprising:
   a radio frequency magnetic field coil;
   a gradient magnetic field coil;
   a gradient driving unit configured to apply a first motion probing gradient (MPG) pulse and a second MPG pulse to the gradient magnetic field coil successively; and
   a radio frequency driving unit configured to apply a radio frequency excitation pulse to the radio frequency magnetic field coil before the first MPG pulse is applied, and for applying a first 90-degree radio frequency refocusing pulse, a 180-degree radio frequency refocusing pulse and a second 90-degree radio frequency refocusing pulse to the radio frequency magnetic field coil successively between a time when the first MPG pulse is applied and a time when the second MPG pulse is applied.

2. The MR imaging system according to claim 1, wherein the gradient driving unit is further configured to a level selecting gradient pulse corresponding to the radio frequency excitation pulse, the first 90-degree radio frequency refocusing pulse, the 180-degree radio frequency refocusing pulse and the second 90-degree radio frequency refocusing pulse respectively to the gradient magnetic field coil.

3. The MR imaging system according to claim 1, wherein the number of the 180-degree radio frequency refocusing pulse is one or more.

4. The MR imaging system according to claim 1, wherein the first 90-degree radio frequency refocusing pulse and the second 90-degree radio frequency refocusing pulse are symmetrical to each other with respect to the 180-degree radio frequency refocusing pulse.

5. The MR imaging system according to claim 1, wherein a time interval between the first MPG pulse and the 180-degree radio frequency refocusing pulse is greater than a time interval between the 180-degree radio frequency refocusing pulse and the second MPG pulse.

6. A method for controlling a pulse sequence of a magnetic resonance (MR) imaging system, the MR imaging system comprising a radio frequency magnetic field coil and a gradient magnetic field coil, the method for controlling a pulse sequence of the MR imaging system comprising:
   applying, by a radio frequency driving unit, a radio frequency excitation pulse to the radio frequency magnetic field coil;
   applying, by a gradient driving unit, a first motion probing gradient (MPG) pulse to the gradient magnetic field coil after the radio frequency excitation pulse is applied;
   applying, by the radio frequency driving unit, a first 90-degree radio frequency refocusing pulse, a 180-degree radio frequency refocusing pulse and a second 90-degree radio frequency refocusing pulse to the radio frequency magnetic field coil successively after the first MPG pulse is applied; and applying, by the gradient driving unit, a second MPG pulse to the gradient magnetic field coil after the second 90-degree radio frequency reunion pulse is applied.

7. The method for controlling a pulse sequence of an MR imaging system according to claim 6, further comprising:

applying, by the gradient driving unit, a level selecting gradient pulse corresponding to the radio frequency excitation pulse, the first 90-degree radio frequency refocusing pulse, the 180-degree radio frequency refocusing pulse and the second 90-degree radio frequency refocusing pulse respectively to the gradient magnetic field coil.

8. The method for controlling a pulse sequence of an MR imaging system according to claim 6, wherein the number of the 180-degree radio frequency refocusing pulse is one or more.

9. The method for controlling a pulse sequence of an MR imaging system according to claim 6, wherein the first 90-degree radio frequency refocusing pulse and the second 90-degree radio frequency refocusing pulse are symmetrical to each other with respect to the 180-degree radio frequency refocusing pulse.

10. The method for controlling a pulse sequence of an MR imaging system according to claim 6, wherein a time interval between the first MPG pulse and the 180-degree radio frequency refocusing pulse is greater than a time interval between the 180-degree radio frequency refocusing pulse and the second MPG pulse.

\* \* \* \* \*